(12) United States Patent
Kyono et al.

(10) Patent No.: US 8,803,274 B2
(45) Date of Patent: Aug. 12, 2014

(54) NITRIDE-BASED SEMICONDUCTOR LIGHT-EMITTING ELEMENT

(75) Inventors: Takashi Kyono, Itami (JP); Yohei Enya, Itami (JP); Yusuke Yoshizumi, Itami (JP); Katsushi Akita, Itami (JP); Masaki Ueno, Itami (JP); Takamichi Sumitomo, Itami (JP); Masahiro Adachi, Osaka (JP); Shinji Tokuyama, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/054,037

(22) PCT Filed: Jun. 18, 2010

(86) PCT No.: PCT/JP2010/060375
§ 371 (c)(1),
(2), (4) Date: Feb. 8, 2011

(87) PCT Pub. No.: WO2011/007641
PCT Pub. Date: Jan. 20, 2011

(65) Prior Publication Data
US 2011/0241016 A1    Oct. 6, 2011

(30) Foreign Application Priority Data

Jul. 15, 2009    (JP) ................................ P2009-167090

(51) Int. Cl.
| | | |
|---|---|---|
| *H01L 31/102* | (2006.01) | |
| *H01L 33/32* | (2010.01) | |
| *B82Y 20/00* | (2011.01) | |
| *H01S 5/343* | (2006.01) | |
| *H01L 33/16* | (2010.01) | |
| *H01S 5/34* | (2006.01) | |
| *H01S 5/32* | (2006.01) | |
| *H01S 5/22* | (2006.01) | |

(52) U.S. Cl.
CPC ............ *H01S 5/34333* (2013.01); *H01L 33/32* (2013.01); *H01S 5/3404* (2013.01); *H01S 5/3213* (2013.01); *B82Y 20/00* (2013.01); *H01S 5/3202* (2013.01); *H01S 5/22* (2013.01); *H01L 33/16* (2013.01)
USPC .............. 257/463; 257/E21.13; 257/E21.463

(58) Field of Classification Search
USPC ..................... 257/E21.113, E21.463, 76, 103
See application file for complete search history.

(56) References Cited

U.S. PATENT DOCUMENTS 6,229,151 B1    5/2001   Takeuchi et al.
(Continued)

FOREIGN PATENT DOCUMENTS

CN    1426119 A    6/2003
(Continued)

OTHER PUBLICATIONS

Funato et al., "Blue, Green, and Amber InGaN/GaN Light-Emitting Diodes on Semipolar {11-22} GaN Bulk Substrates," Japanese Journal of Applied Physics, vol. 45, No. 26, pp. L659-L662 (2006).
(Continued)

*Primary Examiner* — Marc Armand
(74) *Attorney, Agent, or Firm* — Venable LLP; Michael A. Sartori; Tamatane J. Aga

(57) ABSTRACT

A nitride-based semiconductor light-emitting element LE1 or LD1 has: a gallium nitride substrate 11 having a principal surface 11a which makes an angle α, in the range 40° to 50° or in the range more than 90° to 130°, with the reference plane Sc perpendicular to the reference axis Cx extending in the c axis direction; an n-type gallium nitride-based semiconductor layer 13; a second gallium nitride-based semiconductor layer 17; and a light-emitting layer 15 including a plurality of well layers of InGaN and a plurality of barrier layers 23 of a GaN-based semiconductor, wherein the direction of piezoelectric polarization of the plurality of well layers 21 is the direction from the n-type gallium nitride-based semiconductor layer 13 toward the second gallium nitride-based semiconductor layer 17.

10 Claims, 13 Drawing Sheets

(56) References Cited

U.S. PATENT DOCUMENTS

| | | | |
|---|---|---|---|
| 6,569,704 | B1 | 5/2003 | Takeuchi et al. |
| 7,846,757 | B2 | 12/2010 | Farrell, Jr. et al. |
| 2001/0010372 | A1 | 8/2001 | Takeuchi et al. |
| 2002/0008242 | A1 | 1/2002 | Hata |
| 2003/0089917 | A1 | 5/2003 | Krames et al. |
| 2005/0230690 | A1 | 10/2005 | Hata |
| 2007/0093073 | A1* | 4/2007 | Farrell et al. .................. 438/763 |
| 2008/0191223 | A1 | 8/2008 | Nakamura et al. |
| 2008/0285609 | A1 | 11/2008 | Ohta et al. |

FOREIGN PATENT DOCUMENTS

| | | |
|---|---|---|
| JP | 11-112029 A | 4/1999 |
| JP | 2000-058980 A | 2/2000 |
| JP | 2001251022 A | 9/2001 |
| JP | 2002-094188 A | 3/2002 |
| JP | 2003158294 A | 5/2003 |
| JP | 2003347585 A | 12/2003 |
| JP | 2006-521026 A | 9/2006 |
| JP | 2006-278857 A | 10/2006 |
| JP | 2008-504715 A | 2/2008 |
| JP | 2008-505834 A | 2/2008 |
| JP | 2008-263228 A | 10/2008 |
| JP | 2008-543089 T | 11/2008 |
| JP | 2009-001470 A | 1/2009 |
| KR | 10-2008-0025096 A | 3/2008 |
| WO | WO-03/085790 A1 | 10/2003 |
| WO | WO-2006/130696 A2 | 12/2006 |

OTHER PUBLICATIONS

Tyagi et al., "Semipolar (10-1-1) InGaN/GaN Laser Diodes on Bulk GaN Substrates," Japanese Journal of Applied Physics, vol. 46, No. 19, pp. L444-L445 (2007).

Zhong et al., "High power and high efficiency blue light emitting diode on freestanding semipolar (10-1-1) bulk GaN substrate," Applied Physics Letters, vol. 90, No. 23, pp. 233504-1-233504-3 (Jun. 5, 2007).

Gil et al., "Optical anisotropy and polarization fields for wurtzite films deposited on (11-2$n$)-and (10-1$p$)-oriented GaN substrates," Superlattices and Microstructures, vol. 43, No. 5-6, pp. 542-558 (May 1, 2008).

Shen et al., "Determination of polarization field in a semipolar (11-22) InGaN/GaN single quantum well using Franz-Keldysh oscillations in electroreflectance," Applied Physics Letters, vol. 94, No. 24, pp. 241906-1-241906-3 (Jun. 17, 2009).

Office Action in Japanese Patent Application No. 2009-167090 dated Sep. 3, 2013.

Office Action in Japanese Patent Application No. 2009-167090 dated Jan. 28, 2014.

Notification of the Fourth Office Action issued in Chinese Patent Application No. 201080002596.9 dated May 27, 2014.

* cited by examiner

Fig.6

| | EXAMPLE 1 | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | EXAMPLE 2 | COMPARATIVE EXAMPLE 6 | EXAMPLE 3 |
|---|---|---|---|---|---|---|---|---|---|
| PLANE DIRECTION | (10-12) | (0001) | (11-22) | (10-11) | (20-21) | (10-10) | (20-2-1) | (20-21) | (20-2-1) |
| OFF-ANGLE (degrees) | 43 (m AXIS DIRECTION) | 0 | 58 (a AXIS DIRECTION) | 62 (m AXIS DIRECTION) | 75 (m AXIS DIRECTION) | 90 (m AXIS DIRECTION) | 105 (m AXIS DIRECTION) | 75 (m AXIS DIRECTION) | 105 (m AXIS DIRECTION) |
| LIGHT EMISSION WAVELENGTH (nm) | APPROX 500 | APPROX 500 | APPROX 500 | APPROX 500 | APPROX 500 | APPROX 500 | APPROX 500 | APPROX 400 | APPROX 400 |

NITRIDE-BASED SEMICONDUCTOR LIGHT-EMITTING ELEMENT

CROSS-REFERENCE TO RELATED APPLICATIONS

This application is a national stage entry of International Application No. PCT/JP2010/060375 filed Jun. 18, 2010, which claims the benefit of priority to Japanese Patent Application No. 2009-167090 filed Jul. 15, 2009.

TECHNICAL FIELD

This invention relates to a nitride-based semiconductor light-emitting element.

BACKGROUND Art

In Non Patent Literature 1 below, an LED (light-emitting diode) using a GaN substrate having a semipolar principal surface is described. It is stated that this LED is formed on a GaN substrate having the (11-22) plane as a principal surface, has a light-emitting layer with a single quantum well structure comprising InGaN/GaN, and has a light emission wavelength of 600 nm.

In Non Patent Literature 2 below, an LD (laser diode) using a GaN substrate having a semipolar principal surface is described. It is stated that this LD is formed on a GaN substrate having the (10-1-1) plane as a principal surface, has a light-emitting layer with a multiple quantum well structure comprising InGaN/GaN, and has a light emission wavelength of 405.9 nm (blue-violet).

CITATION LIST

Non Patent Literature

Non Patent Literature 1: Mitsuru Funato et al, "Blue, Green, and Amber InGaN/GaN Light-Emitting Diodes on Semi-polar {11-22} GaN Bulk Substrates", Japanese Journal of Applied Physics, Vol. 45, No. 26, 2006, pp. L659-L662

Non Patent Literature 2: Anurag Tyagi et al, "Semipolar (10-1-1) InGaN/GaN Laser Diodes on Bulk GaN Substrates", Japanese Journal of Applied Physics, Vol. 46, No. 19, 2007, pp. L444-L445

SUMMARY OF INVENTION

Technical Problem

As nitride-based semiconductor light-emitting elements, there exist semiconductor multilayers including a light-emitting layer or similar formed on a gallium nitride (GaN) or another nitride-based semiconductor substrate. In such nitride-based semiconductor light-emitting elements, when a GaN substrate having a c plane as a principal surface is used, comparatively large strain occurs in the light-emitting layer. Consequently a quantum Stark effect occurs due to piezoelectric polarization, electrons and holes are spatially separated, and the problem occurs of reduction of the light emission efficiency.

In order to suppress adverse effects due to such piezoelectric polarization, methods are known of manufacturing nitride-based semiconductor light-emitting elements using GaN substrate with a semipolar surface as a principal surface, as described in Non Patent Literature 1 and Non Patent Literature 2 above. By this means, reduction of the light emission efficiency due to piezoelectric polarization can be suppressed.

However, according to knowledge of these inventors, even when a GaN substrate having a semipolar surface as a principal surface is used, in a nitride-based semiconductor light-emitting element comprising a light-emitting layer with a multiple quantum well structure having an InGaN well layer and a barrier layer comprising a GaN-based semiconductor, if the difference in the band gaps of the well layer and the barrier layer becomes large, there are the problems that light emission efficiency is reduced and the driving voltage becomes high, for the following reason.

That is, if the difference between the band gaps of the well layer and the barrier layer becomes large, the band offset in the conduction bands of the well layer and barrier layer becomes large. As a result, focusing on electrons moving from the n-type semiconductor layer to the light-emitting layer, when electrons first arrive at the well layer, the potential that must be overcome when moving to the adjacent barrier layer is high. As a result, electrons do not readily move to the well layer, which is on the p-type semiconductor layer side. On the other hand, the band offset in the valence bands of the well layer and barrier layer is smaller than the band offset in the conduction bands. Consequently holes moving from the p-type semiconductor layer to the light-emitting layer can move comparatively easily to the well layer on the n-type semiconductor layer side.

Consequently, in each of the well layers the injection concentrations of electrons and holes are uneven, so that the light emission efficiency is reduced, and the driving voltage rises.

This invention was devised in light of this problem, and has as an object the provision of a nitride-based semiconductor light-emitting element using a GaN substrate with a semipolar surface as a principal surface, and in which reduction of light emission efficiency and rises in driving voltage can be suppressed even when the difference in band gaps of the well layer and barrier layer is large.

Solution to Problem

In order to resolve the above-described problem, a nitride-based semiconductor light-emitting element of this invention has: a GaN substrate, formed of a hexagonal GaN semiconductor and having a principal surface which makes a finite angle with a reference plane perpendicular to the reference axis extending in the c axis direction of this GaN semiconductor; an n-type nitride-based semiconductor layer; a p-type nitride-based semiconductor layer; and a light-emitting layer comprising a plurality of well layers and a plurality of barrier layers, which are layered in alternation, wherein the principal surface exhibits semipolarity, wherein the finite angle is in a range 40° to 50° or in a range more than 90° to 130°, wherein the light-emitting layer is provided between the n-type nitride-based semiconductor layer and the p-type nitride-based semiconductor layer, wherein each of the plurality of well layers is formed of InGaN, wherein each of the plurality of barrier layers is formed of a GaN-based semiconductor, wherein the difference between the band gap energy of each of the plurality of well layers and the band gap energy of the barrier layers, from among the plurality of barrier layers, adjacent to each of the well layers is 0.7 eV or greater, and wherein the direction of the piezoelectric polarization of each of the plurality of well layers is the direction from the n-type nitride-based semiconductor layer toward the p-type nitride-based semiconductor layer.

By means of a nitride-based semiconductor light-emitting element of this invention, because a GaN substrate a principal surface of which is a semipolar surface is used, compared with a case of using a GaN substrate a principal surface of which is a polar surface, the reduction of the light emission efficiency due to piezoelectric polarization is suppressed. Moreover, by means of a nitride-based semiconductor light-emitting element of this invention, the above-described finite angle is in the range 40° to 50° or in a range more than 90° to 130°, so that the direction of piezoelectric polarization of each of the plurality of well layers is the direction from the n-type nitride-based semiconductor layer toward the p-type nitride-based semiconductor layer. By this means, the shape of the conduction band for each barrier layer is modified such that the energy level declines on the n-type nitride-based semiconductor layer side, and the energy level rises on the p-type nitride-based semiconductor layer side, of the conduction band for the barrier layer. Hence the potential which electrons which have arrived at a well layer from the n-type nitride-based semiconductor layer must overcome when moving to the barrier layer adjacent on the p-type nitride-based semiconductor layer side of the well layer is lowered. By this means, electrons can easily move to the well layer on the p-type nitride-based semiconductor layer side. Hence even when the difference between the band gap energy of the respective well layers and the band gap energy of the barrier layers adjacent thereto is 0.7 eV or greater, recombination of electrons and holes readily occurs. As a result, even when the band gap difference between well layers and barrier layers is large in a nitride-based semiconductor light-emitting element using a GaN substrate a principal surface of which is a semipolar surface, reduction of light emission efficiency and rises in driving voltage are suppressed.

Further, in a nitride-based semiconductor light-emitting element of this invention, the light emission wavelength of the light-emitting layer may be between 460 nm and 550 nm. In order to obtain such a light emission wavelength, the potential of the well layer conduction band must be made deep; normally, reduction of the light emission efficiency and a rise in the driving voltage would readily occur, but by means of a nitride-based semiconductor light-emitting element of this invention, as explained above, reduction of the light emission efficiency and a rise in the driving voltage are suppressed.

Further, in this case a principal surface may be made any one among the {10-12} plane, {11-2-2} plane, and {10-1-1} plane.

Further, in a nitride-based semiconductor light-emitting element of this invention, the finite angle may be in the range 100° to 117°. By this means, the piezoelectric polarization can be made small, so that the reduction of the light emission efficiency due to piezoelectric polarization can be suppressed. And, the amount of 1n incorporation in well layers can easily be increased, so that a nitride-based semiconductor light-emitting element of this invention is particularly useful for realizing a long-wavelength light-emitting element.

Further, in this case a principal surface may be the {20-2-1} plane.

Further, in a nitride-based semiconductor light-emitting element of this invention, a strain relaxation layer formed of InGaN may be further provided; an n-type nitride-based semiconductor layer may be provided between the GaN substrate and the light-emitting layer; and the strain relaxation layer may be provided between the n-type nitride-based semiconductor layer and the light-emitting layer. When the difference between the band gap energy of each of the well layers and the band gap energy of the barrier layers adjacent thereto is 0.7 eV or greater, there is a tendency for strain in well layers to be increased. When such strain occurs, defects occur at the interfaces of well layers and barrier layers, and the light emission efficiency is reduced. As stated above, by providing, below the light-emitting layer, a strain relaxation layer which relaxes strain therewithin, strain in well layers can be suppressed, so that the reduction of the light emission efficiency can be suppressed.

Further, in this case the defect density at the interface on the GaN substrate side of the strain relaxation layer may be $1 \times 10^5$ cm$^{-1}$ or lower. By this means, defects occurring at the interface between well layers and barrier layers can be adequately suppressed by means of the strain relaxation layer, so that reduction of the light emission efficiency can be suppressed particularly effectively.

Further, in this case the defect density at the interface on the GaN substrate side of the strain relaxation layer may be made $5 \times 10^3$ cm$^{-1}$ or higher. By this means, strain is relaxed to a certain degree in each of the layers on the GaN substrate side from the strain relaxation layer, so that defects occurring at interfaces between well layers and barrier layers can be suppressed particularly effectively by the strain relaxation layer, and reduction of the light emission efficiency can be suppressed particularly effectively.

Further, in a nitride-based semiconductor light-emitting element of this invention, 50% or more by volume of the n-type nitride semiconductor layer is formed of GaN or InAlGaN. These materials have a small lattice mismatch with the InGaN of well layers, and when formed on a GaN substrate, strain relaxation in a layer comprising such materials is also small. Hence strain in well layers can be made small, and reduction of the light emission efficiency can be suppressed particularly effectively.

Advantageous Effects of Invention

According to this invention, a nitride-based semiconductor light-emitting element can be provided in which reduction of the light emission efficiency and rises in driving voltage can be suppressed, even when the difference between band gaps of well layers and barrier layers is large.

BRIEF DESCRIPTION OF DRAWINGS

FIG. 6 shows the principal surface plane direction, off-angle (angle α), and light emission wavelength in Example 1 to Example 3 and Comparative Example 1 to Comparative Example 6;

DESCRIPTION OF EMBODIMENTS

Figure 1:
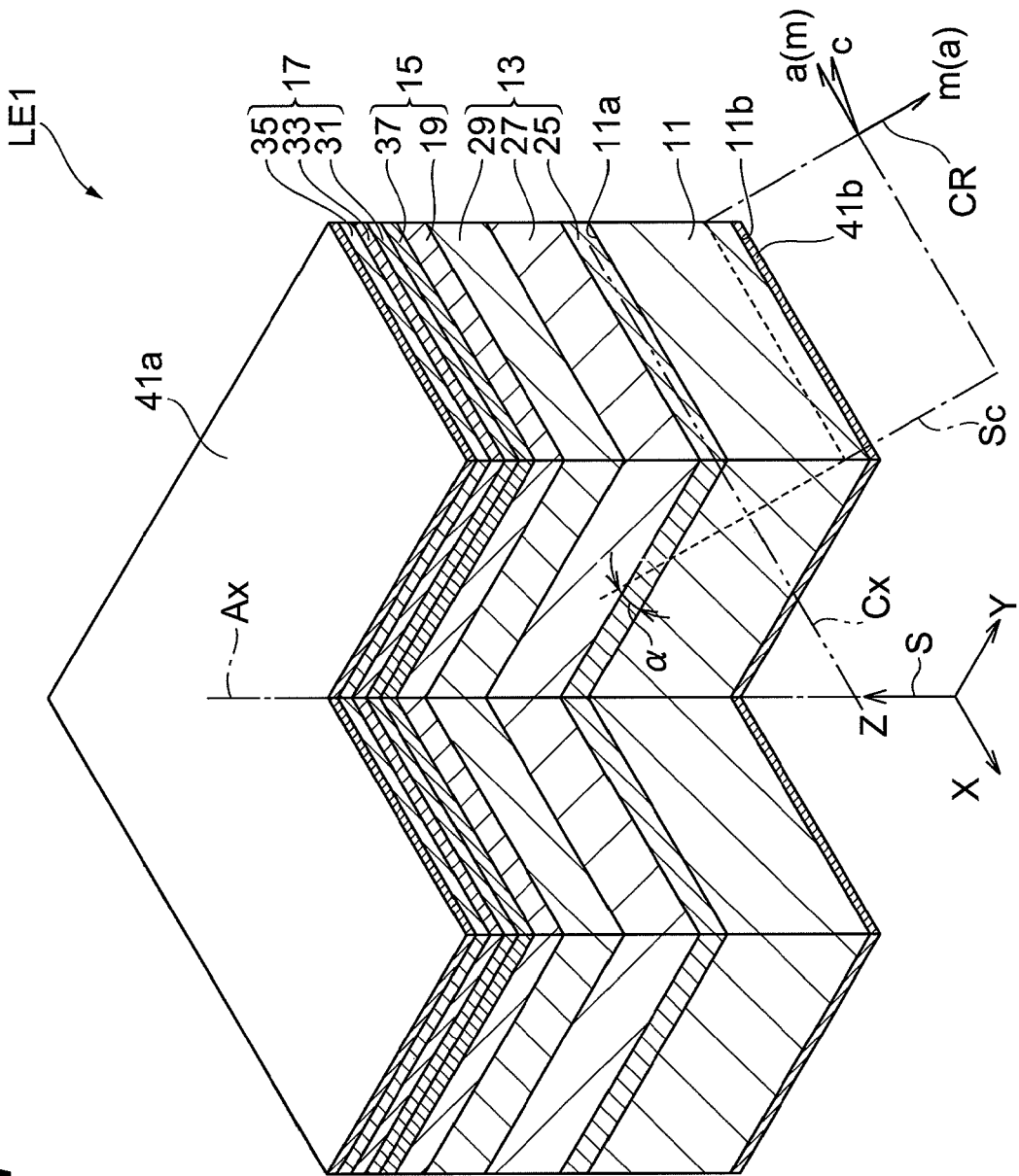
FIG. 1 shows in summary the structure of a nitride-based semiconductor light-emitting element.

Below, nitride-based semiconductor light-emitting elements of embodiments are explained in detail, referring to the drawings. In each of the drawings, where possible the same symbols are used for the same elements. Further, dimensional ratios in constituent elements and between constituent elements in drawings are arbitrary to facilitate understanding of the drawings.

FIG. 1 shows in summary the structure of the nitride-based semiconductor light-emitting element of this embodiment. The nitride-based semiconductor light-emitting element may for example be a semiconductor laser, light-emitting diode, or similar.

The nitride-based semiconductor light-emitting element LE1 has a structure appropriate for a light-emitting diode. The nitride-based semiconductor light-emitting element LE1 comprises a gallium nitride substrate 11 comprising hexagonal-system gallium nitride (GaN) semiconductor, an n-type gallium nitride-based semiconductor layer 13, a light-emitting layer 15, and a p-type gallium nitride-based semiconductor layer 17.

The gallium nitride substrate 11 has a principal surface 11a and a rear surface 11b. The principal surface 11a of the gallium nitride substrate 11 exhibits semipolarity.

FIG. 1 shows a crystal coordinate system CR, comprising the crystal a axis, m axis, and c axis of the hexagonal system of the gallium nitride semiconductor. For example, the c plane in the hexagonal system is denoted by "(0001)", and the plane direction denoted by "(000-1)" is directed opposite the (0001) plane. Further, in FIG. 1 an orthogonal coordinate system S, comprising the geometric coordinate axes X, Y, Z, is shown. In the orthogonal coordinate system S, the X axis and Y axis are set in directions parallel to the principal surface 11a, and the Z axis is set in the thickness direction of the gallium nitride substrate 11.

The principal surface 11a of the gallium nitride substrate 11 is inclined at a finite angle α, within the range 40° to 50° or within the range more than 90° to 130°, with respect to the reference plane Sc perpendicular to the reference axis Cx. Here, the reference axis Cx extends in the c axis direction of the gallium nitride semiconductor. In this example, the principal surface 11a is inclined at a finite angle α toward the m axis direction with respect to the reference plane Sc, but may also be inclined at a finite angle α toward the a axis direction, or a finite angle α with the reference plane Sc may be made by means of inclination with respect to both the m axis and the a axis. This finite angle α is called the off-angle with respect to the c plane of the gallium nitride substrate 11.

The n-type gallium nitride-based semiconductor layer 13, light-emitting layer 15, and p-type gallium nitride-based semiconductor layer 17 are all epitaxial layers, and are arranged on the principal surface 11a along the Ax axis parallel to the Z axis.

The light-emitting layer 15 is provided between the n-type gallium nitride-based semiconductor layer 13 and the p-type gallium nitride-based semiconductor layer 17. The n-type gallium nitride-based semiconductor layer 13 may comprise one or a plurality of n-type gallium nitride-based semiconductor layers (in this embodiment, the gallium nitride-based semiconductor layers 25, 27, 29). The p-type gallium nitride-based semiconductor layer 17 comprises a gallium nitride-based semiconductor layer 31 having a band gap greater than the band gap of the barrier layers of the light-emitting layer 15, and one or a plurality of p-type gallium nitride-based semiconductor layers (in this embodiment, the gallium nitride-based semiconductor layers 33, 35).

The light-emitting layer 15 may comprise an active layer 19 and a gallium nitride semiconductor layer 37. The gallium nitride semiconductor layer 37 may be an undoped gallium nitride semiconductor layer.

Figure 2:
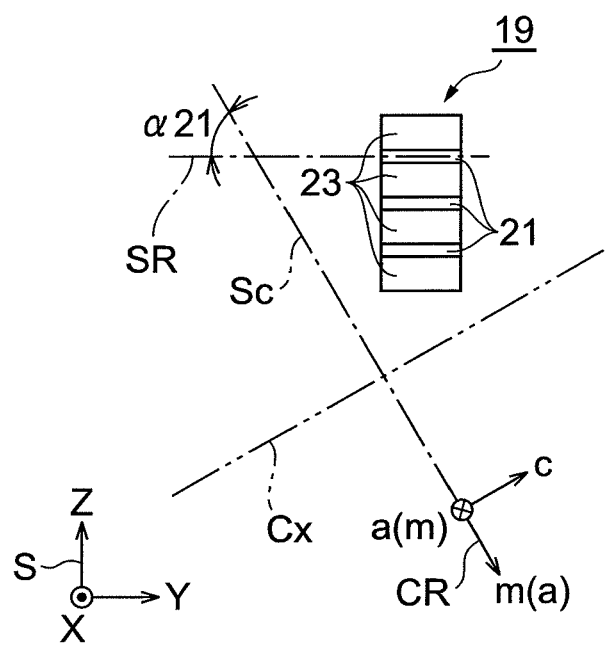
FIG. 2 shows the cross-sectional structure near the light-emitting layer of a nitride-based semiconductor light-emitting element.

Next, details of the active layer 19 are explained referring to FIG. 2. FIG. 2 shows the cross-sectional structure near the light-emitting layer of the nitride-based semiconductor light-emitting element.

As shown in FIG. 2, the active layer 19 has a plurality of well layers 21 and a plurality of barrier layers 23, layered in alternation. That is, the active layer 19 has a multiple quantum well structure. The well layers 21 comprise hexagonal InGaN. The barrier layers 23 comprise hexagonal gallium nitride-based semiconductor, and may for example be GaN, InGaN, AlGaN, AlGaInN, or similar. The difference between the band gap energy of each of the well layers 21 and the band gap energy of the barrier layers 23 adjacent to the well layers 21 is 0.7 eV or greater.

Further, the well layers 21 extend along the reference plane SR inclined at the finite angle α21 with respect to the reference plane Sc perpendicular to the reference axis Cx extending in the c axis direction. That is, the finite angle α21 made by the reference plane Sc and the reference plane SR is substantially equal to the finite angle α made by the reference plane Sc and the principal surface 11a. The well layers 21 include strain, and piezoelectric polarization in the well layers 21 has a component in the direction from the n-type gallium nitride-based semiconductor layer 13 toward the p-type gallium nitride-based semiconductor layer 17 (the positive Z-axis direction). The lattice constants in the a axis and c axis directions of InGaN are larger than the lattice constants in the a axis and c axis directions of GaN, so that the well layers 21, comprising InGaN, receive stress (compressive strain) from the barrier layers 23, and include strain. The direction of the above piezoelectric polarization can be determined by adjusting the finite angle α made by the principal surface 11a and the reference plane Sc, that is, by appropriately selecting the crystal plane of the principal surface 11a.

Further, as shown in FIG. 1, the gallium nitride-based semiconductor layer 25 of the n-type gallium nitride-based semiconductor layer 13 may be a buffer layer comprising, for example, n-type GaN or InAlGaN doped with Si or similar. The gallium nitride-based semiconductor layer 27 is for example a layer to provide n-type carriers, and may be an n-type GaN layer or InAlGaN layer doped with Si or similar. The gallium nitride-based semiconductor layer 29 is a strain relaxation layer to relax strain in the well layers 21. The gallium nitride-based semiconductor layer 29 may for example be an n-type InGaN layer doped with Si or similar. The n-type gallium nitride-based semiconductor layer 13 need not have a gallium nitride-based semiconductor layer 29 as a strain relaxation layer.

The gallium nitride-based semiconductor layer 31 within the p-type gallium nitride-based semiconductor layer 17 may be made either an electron blocking layer or a cladding layer. An electron blocking layer blocks electrons from the light-emitting layer; a cladding layer confines carriers and confines light. The gallium nitride-based semiconductor layer 31 may for example comprise p-type AlGaN doped with Mg or similar. The gallium nitride-based semiconductor layer 33 may for example comprise p-type GaN doped with Mg or similar. The gallium nitride-based semiconductor layer 35 is for example a p$^+$-type GaN contact layer doped with Mg.

Further, on the gallium nitride-based semiconductor layer 35 is provided a first electrode (for example, an anode) 41a, and on the rear surface 11b is provided a second electrode (for example, a cathode) 41b. When carriers are injected into the active layer 19 via these electrodes, light is generated.

Next, the nitride-based semiconductor light-emitting element of a modified example of this embodiment is explained. In the explanation of this modified example, elements similar to those of the above-described nitride-based semiconductor light-emitting element LE1 are assigned the same symbols, and a detailed explanation thereof may be omitted.

Figure 3:
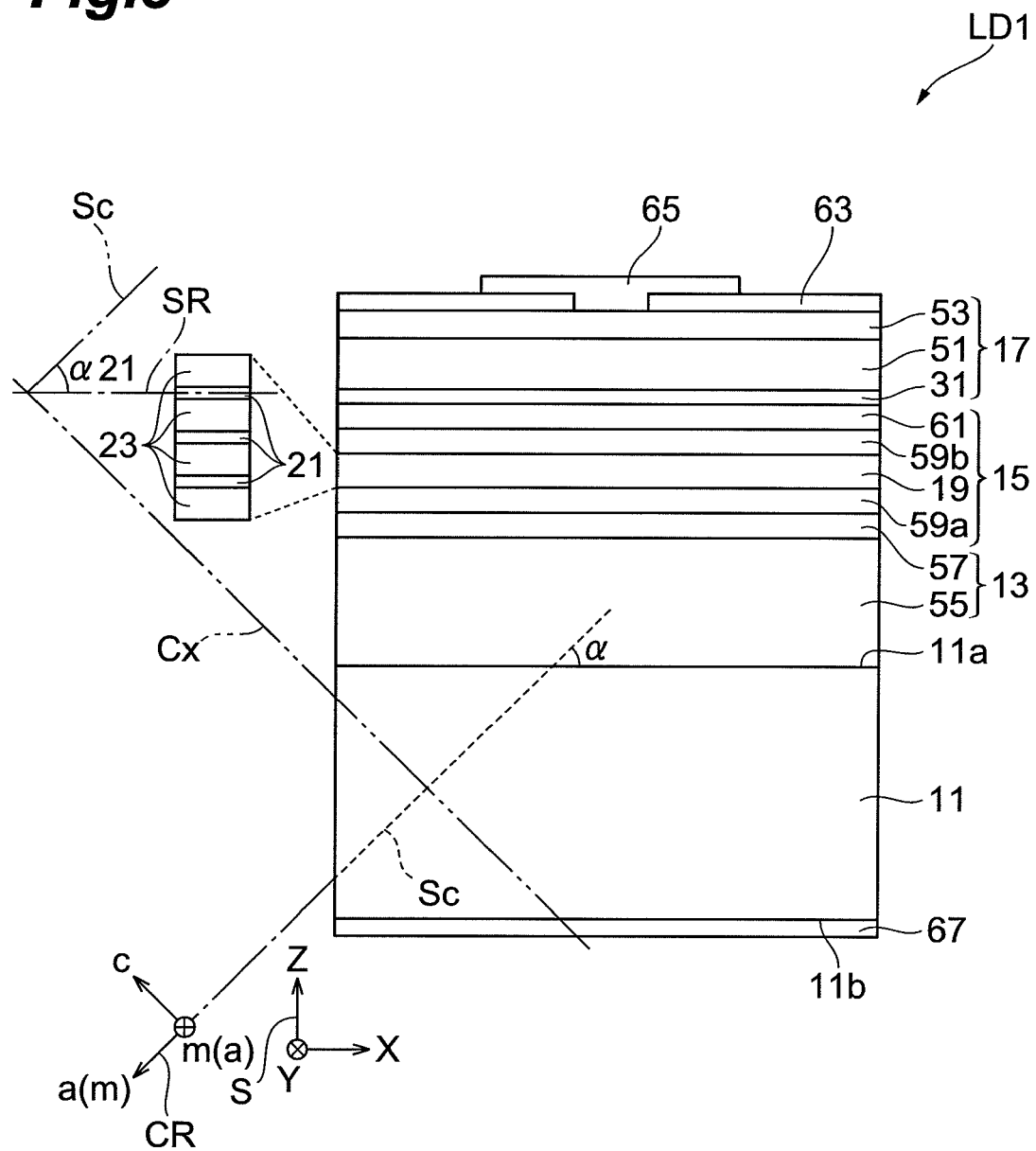
FIG. 3 shows in summary the structure of a nitride-based semiconductor light-emitting element.

FIG. 3 shows in summary the structure of a nitride-based semiconductor light-emitting element of this embodiment. The nitride-based semiconductor light-emitting element LD1 may for example be a semiconductor laser or similar.

The nitride-based semiconductor light-emitting element LD1 has a structure appropriate for a semiconductor laser. The nitride-based semiconductor light-emitting element LD1 comprises a gallium nitride substrate 11, n-type gallium nitride-based semiconductor layer 13, light-emitting layer 15, and p-type gallium nitride-based semiconductor layer 17. The light-emitting layer 15 comprises an active layer 19; the active layer 19 has a quantum well structure comprising a plurality of well layers 21 and a plurality of barrier layers 23, layered in alternation. The light-emitting layer 15 is provided between the n-type gallium nitride-based semiconductor layer 13 and the p-type gallium nitride-based semiconductor layer 17. The n-type gallium nitride-based semiconductor layer 13 may comprise one or a plurality of n-type gallium nitride-based semiconductor layers (in this example, gallium nitride-based semiconductor layers 55, 57). The p-type gallium nitride-based semiconductor layer 17 comprises a gallium nitride-based semiconductor layer 31 having a band gap larger than the band gap of the barrier layers 23, and one or a plurality of p-type gallium nitride-based semiconductor layers (in this example, gallium nitride-based semiconductor layers 51, 53).

The gallium nitride-based semiconductor layer 55 may for example be an n-type AlGaN cladding layer doped with Si or similar. The gallium nitride-based semiconductor layer 57 is a strain relaxation layer to relax strain in the well layers 21. The gallium nitride-based semiconductor layer 57 may for example be an n-type InGaN layer doped with Si or similar. The light-emitting layer 15 may comprise a first light guiding layer 59a, second light guiding layer 59b, and undoped GaN layer 61. The active layer 19 is provided between the first light guiding layer 59a and the second light guiding layer 59b. The first light guiding layer 59a and second light guiding layer 59b may for example comprise undoped InGaN. On the second light guiding layer 59b is provided the undoped GaN layer 61. The n-type gallium nitride-based semiconductor layer 13 may not have the gallium nitride-based semiconductor layer 57.

The gallium nitride-based semiconductor layer 31 may for example be a p-type AlGaN layer doped with Mg or similar. The gallium nitride-based semiconductor layer 51 may for example be a p-type AlGaN cladding layer doped with Mg or similar. The gallium nitride-based semiconductor layer 53 is for example a p$^+$-type GaN contact layer doped with Mg or similar.

On the p-type gallium nitride-based semiconductor layer 17 is provided an insulating film 63 having a stripe window. An electrode is formed on the insulating film 63 and p-type gallium nitride-based semiconductor layer 17. A first electrode (for example, an anode) 65 is provided on the gallium nitride-based semiconductor layer 53, and a second electrode (for example, a cathode) 67 is provided on the rear surface 11b. The active layer 19 generates laser light in response to injection of carriers via these electrodes.

Further, in this modified example the principal surface 11a of the gallium nitride substrate 11 is inclined at a finite angle α in the a axis direction with respect to the reference plane Sc.

By means of the nitride-based semiconductor light-emitting elements LE1 and LD1 of the above-described embodiment, because a gallium nitride substrate 11 having a semipolar surface as the principal surface 11a is used (see FIG. 1 and FIG. 3), compared with cases in which a gallium nitride substrate having a polar surface as the principal surface is used, piezoelectric polarization in the well layers 21 is reduced. Consequently, the quantum Stark effect arising from piezoelectric polarization is suppressed, so that reduction of the light emission efficiency can be suppressed.

Figure 4:
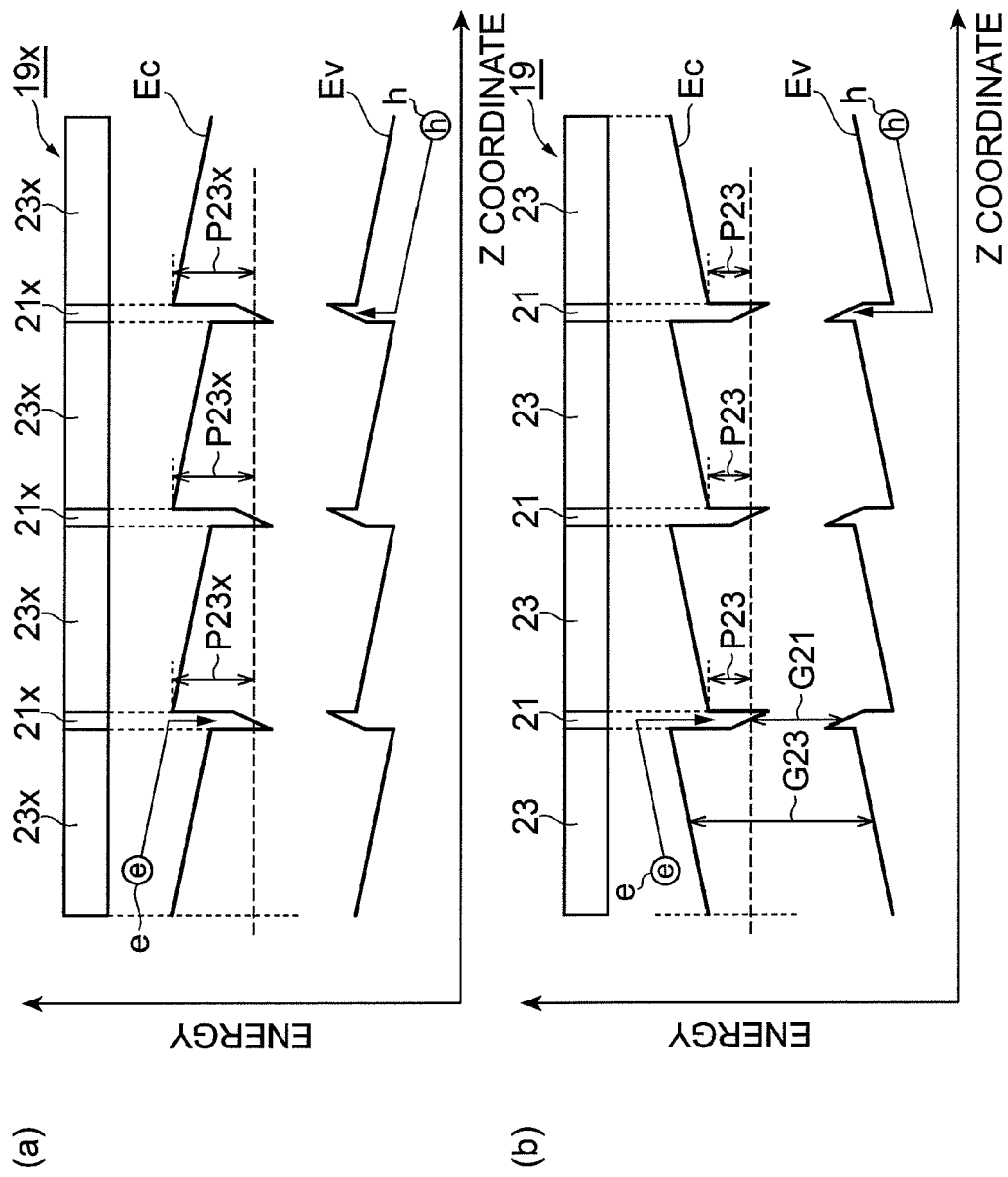
FIG. 4 shows energy band diagrams of light-emitting layers.

In addition, by means of the nitride-based semiconductor light-emitting elements LE1 and LD1 of the above-described embodiment, because the finite angle α is in the range 40° to 50° or in the range more than 90° to 130° (see FIG. 1 and FIG. 3), the piezoelectric polarization direction of each of the plurality of well layers 21 is the direction from the n-type gallium nitride-based semiconductor layer 13, which is n-type, to the p-type gallium nitride-based semiconductor layer 17, which is p-type. As a result, in a nitride-based semiconductor light-emitting layer which uses a gallium nitride substrate 11 having as the principal surface 11a a semipolar surface, even if the difference in band gaps of the well layers 21 and the barrier layers 23 is large, reduction of the light emission efficiency and rises in driving voltage are suppressed. This principle is explained referring to FIG. 4.

FIG. 4(a) is an energy band diagram of a light-emitting layer in a case in which the piezoelectric polarization of the well layers is in the direction from the p-type semiconductor layer toward the n-type semiconductor layer; FIG. 4(b) is an energy band diagram of a light-emitting layer in a case in which the piezoelectric polarization of the well layers is in the direction from the n-type semiconductor layer toward the p-type semiconductor layer.

In FIG. 4(a), the active layer 19x comprising a plurality of InGaN well layers 21x and GaN barrier layers 23x, layered in alternation, is shown; the conduction band Ec and valence band Ev of the well layers 21x and barrier layers 23x corresponding to the Z coordinate in the active layer 19x are shown. In FIG. 4(b), the conduction band Ec and valence band Ev of the well layers 21 and barrier layers 23 corresponding to the Z coordinate in the active layer 19 are shown.

As shown in FIG. 4(a), when the direction of piezoelectric polarization in well layers is the direction from the p-type semiconductor layer toward the n-type semiconductor layer (the negative Z-axis direction), due to piezoelectric polarization of the well layers 21x, the shape of the conduction band Ec of the barrier layers 23x is deformed such that the energy level on the n-type semiconductor layer side (the negative Z-axis direction side) of the barrier layers 23x is higher and the energy level on the p-type semiconductor side (the positive Z-axis direction side) is lower. Hence the potential P23x which must be overcome when electrons e arriving at well layers 21x move to the barrier layer 23x adjacent to the p-type semiconductor layer side is higher. Consequently, electrons e cannot readily move to the p-type semiconductor layer side. Further, it is known that when well layers comprise InGaN and barrier layers comprise GaN, the band offset of the valence band Ev at the interfaces between well layers 21x and barrier layers 23x is comparatively small. Hence holes h move comparatively readily from the p-type semiconductor layer side to the n-type semiconductor layer side. Consequently in each of the well layers 21x, the injection concentrations of electrons e and holes h becomes uneven, so that the light emission efficiency is reduced, and the driving voltage rises.

On the other hand, as shown in FIG. 4(b), when the direction of piezoelectric polarization in the well layers is the direction from the n-type semiconductor layer to the p-type semiconductor layer (the positive Z-axis direction), the shape of the conduction band Ec of the barrier layers 23 is deformed such that the energy level on the n-type nitride-based semiconductor layer side of the barrier layers 23 is lowered and the energy level on the p-type nitride-based semiconductor layer side is raised. Hence the potential P23 which must be overcome by electrons e arriving at well layers 21 from the n-type nitride-based semiconductor layer when moving to the barrier layer 23 adjacent to the p-type nitride-based semiconductor layer side of the well layer 21 is lowered. By this means, electrons e readily move to the well layer 21 on the p-type nitride-based semiconductor layer side. As a result, even when the difference between the band gap energy G21 of each of the well layers 21 and the band gap energy G23 of the adjacent barrier layers 23 is 0.7 eV or greater, electrons e and holes h readily recombine, so that reduction of the light emission efficiency and a rise in the driving voltage are suppressed.

In the nitride-based semiconductor light-emitting elements LE1 and LD1 of the embodiment described above, the light emission wavelength of the light-emitting layer 15 (active layer 19) may be between 460 and 550 nm. In order to obtain such a light emission wavelength, the potential of the conduction band Ec of the well layers 21 must be made deep (see FIG. 4); normally, reduction of the light emission efficiency and rises in driving voltage readily occur. However, by means of the nitride-based semiconductor light-emitting elements LE1 and LD1 of the above-described embodiments, reduction of the light emission efficiency and rises in driving voltage are suppressed, as explained above.

Further, in the nitride-based semiconductor light-emitting elements LE1 and LD1 of the embodiment as described above, the principal surface 11a may be made any among the {10-12} plane, the {11-2-2} plane, or the {10-1-1} plane.

Further, in the nitride-based semiconductor light-emitting elements LE1 and LD1 of the embodiment as described above, the finite angle α may be in the range 100° to 117°. By this means the piezoelectric polarization of the well layers 21 can be made small, so that reduction of the light emission efficiency due to piezoelectric polarization can be suppressed. Further, because the amount of In incorporation in well layers 21 can easily be increased, the nitride-based semiconductor light-emitting elements LE1 and LD1 are particularly advantageous for realizing long-wavelength light-emitting elements. Further, when the finite angle α is in the range 100° to 117°, the principal surface 11a may be the {20-2-1} plane.

Further, the nitride-based semiconductor light-emitting elements LE1 and LD1 of the embodiment as described above further comprise, as strain relaxation layers comprising InGaN, a gallium nitride-based semiconductor layer 29 (FIG. 1) and a gallium nitride-based semiconductor layer 57 (FIG. 3). When the difference between the band gap energy G21 of each of the well layers 21 and the band gap energy G23 of the barrier layers 23 adjacent thereto is 0.7 eV or greater, there is a tendency for strain in the well layers 21 to become large. When such strain occurs, defects occur at the interfaces between well layers 21 and barrier layers 23, and the light emission efficiency is reduced. As explained above, by providing a strain relaxation layer which relaxes this strain below the active layer 19, strain in the well layers 21 can be suppressed, so that reduction of the light emission efficiency can be suppressed.

Further, when a nitride-based semiconductor light-emitting element LE1 or LD1 comprises a strain relaxation layer (gallium nitride-based semiconductor layer 29 or gallium nitride-based semiconductor layer 57) as in the case of the above-described embodiment, the defect density at the interface of the strain relaxation layer on the side of the gallium nitride substrate 11 may be made $1 \times 10^5$ cm$^{-1}$ or lower (see FIG. 1 and FIG. 3). By this means, defects at the interface of the well layers 21 and barrier layers 23 can be adequately suppressed by the strain relaxation layer (see FIG. 2), so that reduction of the light emission efficiency can be suppressed particularly effectively.

Further, in this case the defect density at the interface on the gallium nitride substrate 11 side of the strain relaxation layer (gallium nitride-based semiconductor layer 29 or gallium nitride-based semiconductor layer 57) may be made $5 \times 10^3$ cm$^{-1}$ or higher (see FIG. 1 and FIG. 3). By this means, strain is relaxed to a certain degree in each of the layers (gallium nitride-based semiconductor layer 27, gallium nitride-based semiconductor layer 25, gallium nitride-based semiconductor layer 55) on the gallium nitride substrate 11 side of the strain relaxation layer, so that defects occurring at the interfaces of well layers 21 and barrier layers 23 can be suppressed particularly effectively by the strain relaxation layer, and reduction of the light emission efficiency can be suppressed particularly effectively.

Further, in the nitride-based semiconductor light-emitting elements LE1 and LD1 of the embodiment as described above, 50% or more by volume of the n-type nitride semiconductor layer is formed of GaN or InAlGaN (see FIG. 1 and FIG. 3). These materials have a small lattice mismatch with the InGaN of the well layers 21, and when formed on the gallium nitride substrate 11, strain relaxation in a layer comprising such materials is also small. Hence strain in the well layers 21 can be made small, and reduction of the light emission efficiency can be suppressed particularly effectively.

EXAMPLES

Below, examples and comparative examples are explained.

Figure 5:
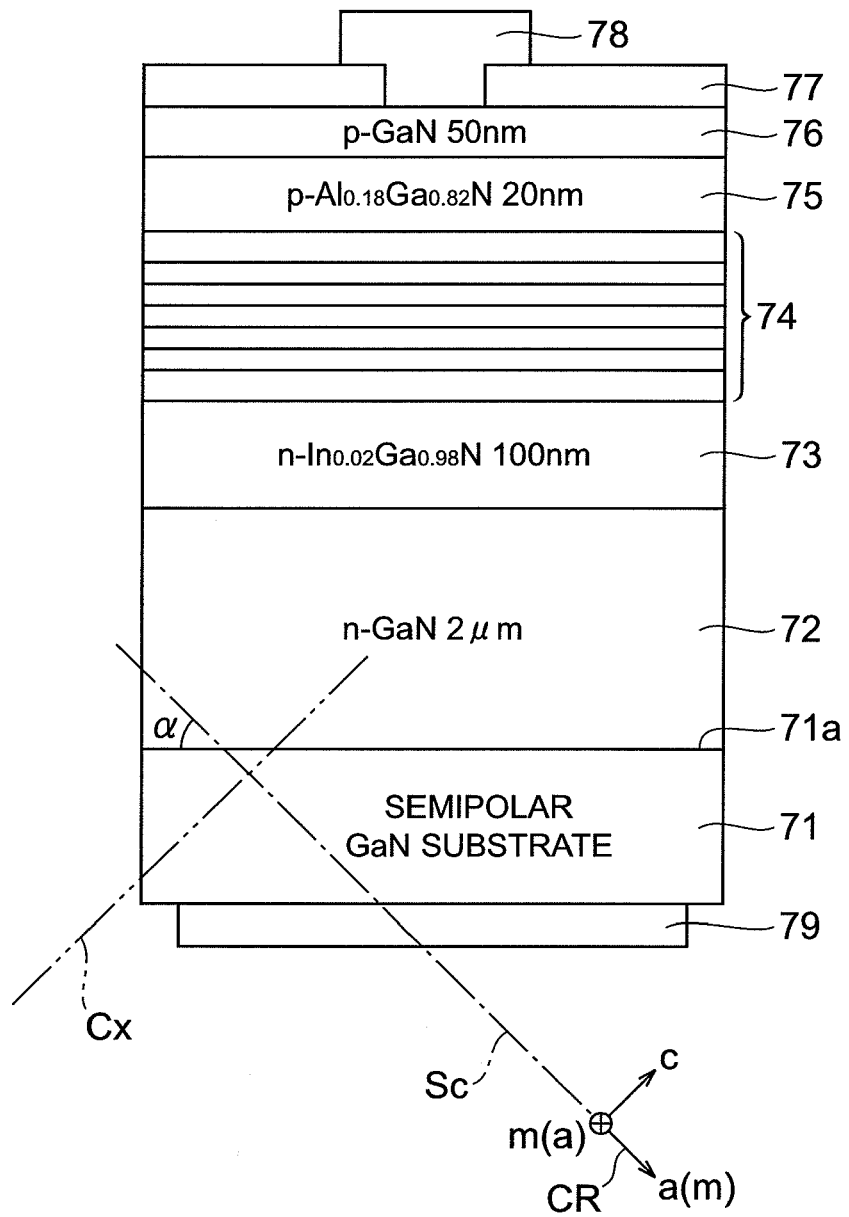
FIG. 5 shows the LED structure of Example 1 to Example 3 and Comparative Example 1 to Comparative Example 6.

As Example 1 to Example 3 and Comparative Example 1 to Comparative Example 6, LEDs (light-emitting diodes) were fabricated. FIG. 5 shows the LED structure of Example 1 to Example 3 and Comparative Example 1 to Comparative Example 6. As shown in FIG. 5, a GaN substrate 71 was prepared. In each of the examples and comparative examples, the value of the finite angle α (off-angle) made by the principal surface 71a of the GaN substrate 71 and the reference plane Sc perpendicular to the reference axis Cx was changed. That is, in each example and comparative example, the plane direction of the principal surface 71a was changed. The GaN substrate 71 was placed on a growth reactor, ammonia (NH$_3$) and hydrogen (H$_2$) were supplied, and the GaN substrate 71 was held for 10 minutes in an atmosphere at 1050° C. After this pretreatment (thermal cleaning), raw material gas was supplied to the growth reactor, and structures for LEDs were fabricated as follows.

First, an n-type GaN guiding layer 72 was grown to 2 μm at 1100° C. An n-type In$_{0.02}$Ga$_{0.98}$N strain relaxation layer 73 was grown to 100 nm at 800° C. Then, the light-emitting layer 74 was grown. The light-emitting layer 74 had a quantum well structure in which barrier layers comprising 15 nm GaN and well layers comprising 3 nm InGaN were layered in alternation. Depending on the off-angle of the GaN substrate 71, the ease of incorporation of well layer. In was made different. Hence in each of the examples and comparative examples, the growth temperatures of the well layers and barrier layers were adjusted such that the well layers had the desired composition, and the desired light emission wavelength was obtained. The number of well layers was three. Next, a 20 nm p-type $Al_{0.18}Ga_{0.82}N$ electron blocking layer 75 and a 50 nm p-type GaN contact layer 76 were grown, in order, at 1000° C. Further, on the p-type GaN contact layer 76 were evaporation-deposited an anode 77 comprising Ni/Au and having an opening, and a pad electrode 78 comprising Ti/Au and in contact with the p-type GaN contact layer 76 via the opening in the anode 77. Further, a cathode 79 comprising Ti/Al was evaporation-deposited onto the rear surface of the GaN substrate 71.

FIG. 6 shows the principal surface plane direction, the off-angle (angle α), and the approximately light emission wavelength, of Example 1 to Example 3 and Comparative Example 1 to Comparative Example 6. As shown in FIG. 6, plane directions were, in order for Example 1, Comparative Example 1 to Comparative Example 5, Example 2, Comparative Example 6, and Example 3, respectively (10-12), (0001), (11-22), (10-11), (20-21), (10-10), (20-2-1), (20-21), and (20-2-1). Further, off-angles were, in order for Example 1, Comparative Example 1 to Comparative Example 5, Example 2, Comparative Example 6, and Example 3, respectively 43° (m axis direction), 0°, 58° (a axis direction), 62° (m axis direction), 75° (m axis direction), 90° (m axis direction), 105° (m axis direction), 75° (m axis direction), 105° (m axis direction). Light emission wavelengths were near 500 nm for Example 1, Example 2, and Comparative Example 1, Example 2, Comparative Example 1 to Comparative Example 5, and were near 400 nm for Example 3 and Comparative Example 6.

Next, for Example 1, Example 2, and Comparative Example 1 to Comparative Example 5, while applying a forward bias, each of the LEDs was irradiated from above the anode 77 with excitation light, and by detecting PL (photoluminescence), the direction of piezoelectric polarization of the well layers was determined. The principle of such bias-application PL measurement is explained referring to FIG. 7 and FIG. 8.

Figure 7:
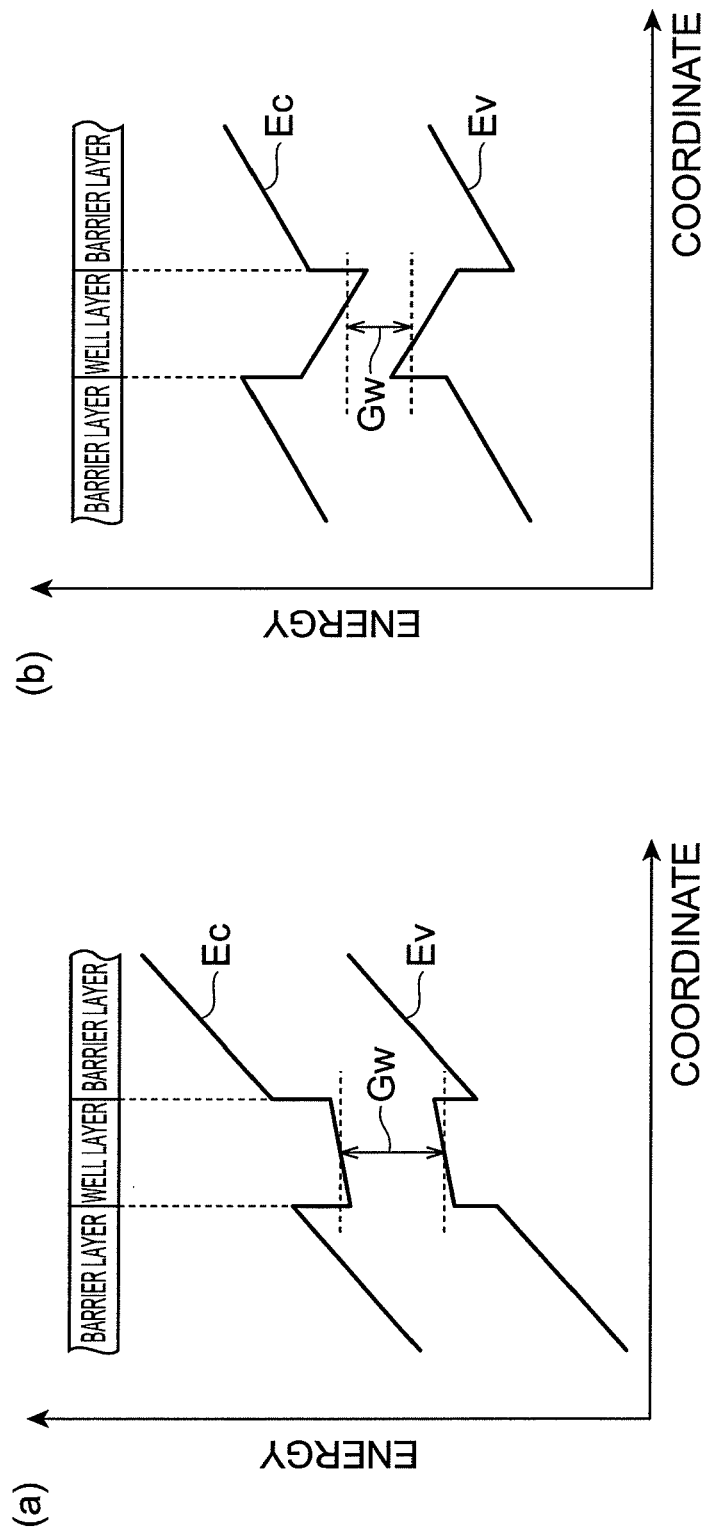
FIG. 7 shows energy band diagrams for a well layer and barrier layer.

FIG. 7 is an energy band diagram for a well layer and barrier layer, when the piezoelectric polarization in the well layer (strictly speaking, the internal electric field which combines the piezoelectric polarization and the spontaneous polarization) is strong and positive. The horizontal axis in FIG. 7 takes as the positive direction the direction from the n-type nitride-based semiconductor layer toward the p-type nitride-based semiconductor layer. FIG. 7(*a*) shows the state prior to forward bias application; FIG. 7(*b*) shows the state after forward bias application.

Figure 8:
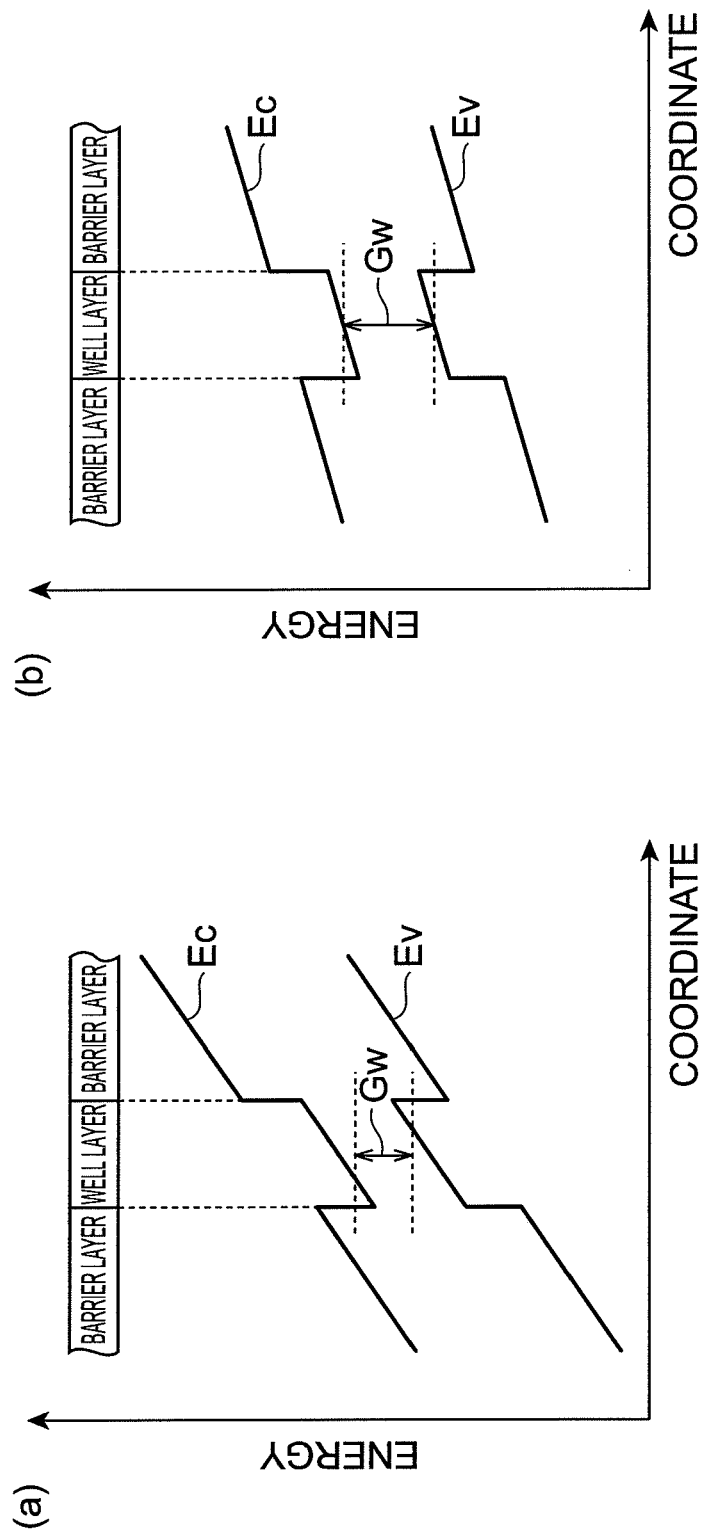
FIG. 8 shows energy band diagrams for a well layer and barrier layer.

FIG. 8 is an energy band diagram for a well layer and barrier layer, when the piezoelectric polarization in the well layer (strictly speaking, the internal electric field which combines the piezoelectric polarization and the spontaneous polarization) is weak and positive or is negative. The horizontal axis in FIG. 8 takes as the positive direction the direction from the n-type nitride-based semiconductor layer toward the p-type nitride-based semiconductor layer. FIG. 8(*a*) shows the state prior to forward bias application; FIG. 8(*b*) shows the state after forward bias application.

As shown in FIG. 7, when the piezoelectric polarization of a well layer is strong and positive, through forward bias application the direction of inclination of the conduction band Ec and valence band Ev of the well layer changes. By this means, through forward bias application, the difference Gw between the minimum energy level in the conduction band Ec and the maximum energy level in the valence band Ev for the well layer becomes small. As a result, through forward bias application, the PL wavelength is red-shifted.

On the other hand, as shown in FIG. 8, when the piezoelectric polarization of a well layer is weak and positive or is negative, through forward bias application the direction of inclination of the conduction band Ec and valence band Ev of the well layer remains the same, and the inclination becomes smaller. By this means, through forward bias application the difference Gw between the minimum energy level in the conduction band Ec and the maximum energy level in the valence band Ev for the well layer becomes large. As a result, through forward bias application, the PL wavelength is blue-shifted. Such measurements were performed at an absolute temperature of 100K and for various forward bias magnitudes for Example 1, Example 2, and Comparative Example 1 to Comparative Example 5.

Figure 9:
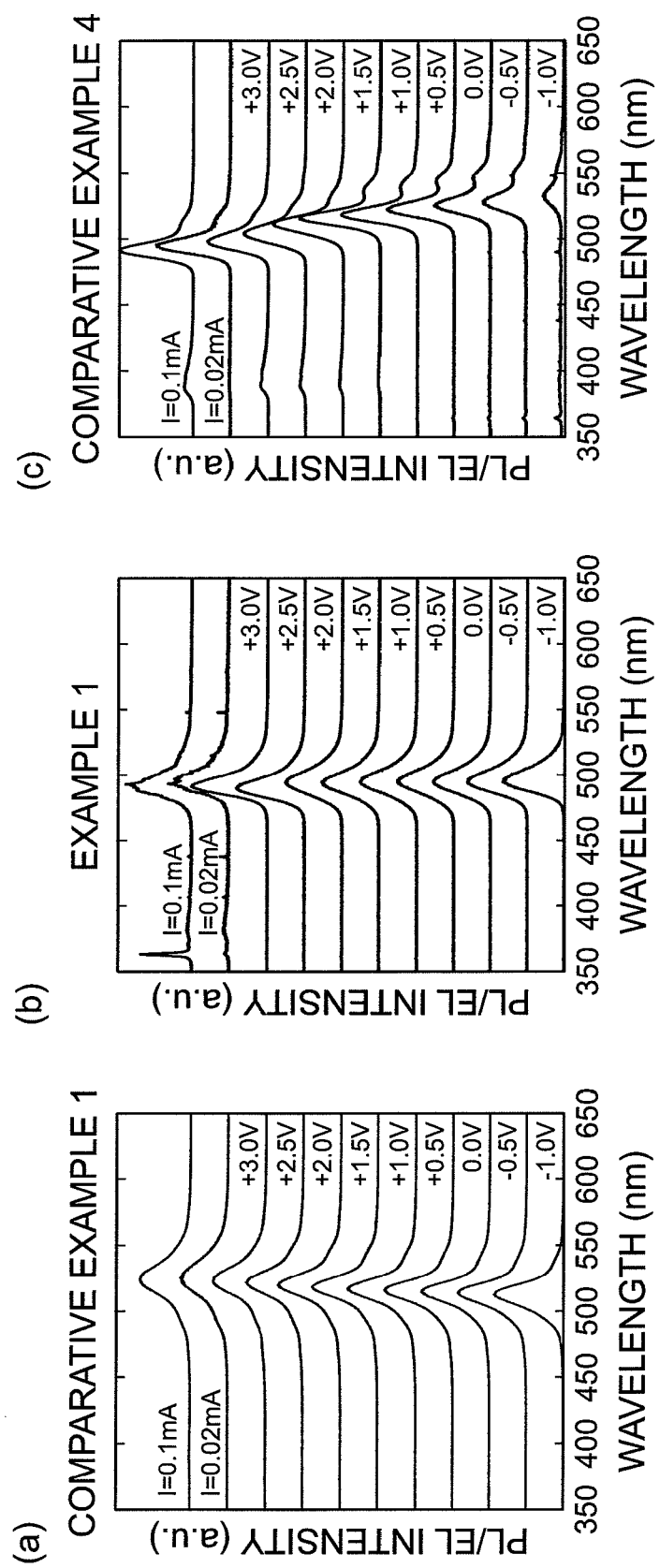
FIG. 9 shows measurement results for Comparative Example 1, Example 1, and Comparative Example 4.

FIG. 9(*a*), FIG. 9(*b*), and FIG. 9(*c*) show bias application PL measurement results for Comparative Example 1, Example 1, and Comparative Example 4, respectively, for a plurality of forward bias values. The horizontal axes of the graphs in FIG. 9 indicate the PL peak wavelength, and the vertical axis indicate the light intensity, normalized by dividing the PL intensity by the EL intensity. As shown in FIG. 9, as the forward bias value increases in Comparative Example 1 the PL peak wavelength is red-shifted, and in Example 1 there is almost no change in the PL peak wavelength. From this it was found that the piezoelectric polarization of the well layer is positive in Comparative Example 1 and Example 1. Further, as the forward bias value increases in Comparative Example 4, the PL peak wavelength is blue-shifted. From this it was found that in Comparative Example 4 the piezoelectric polarization of the well layer is negative.

Figure 10:
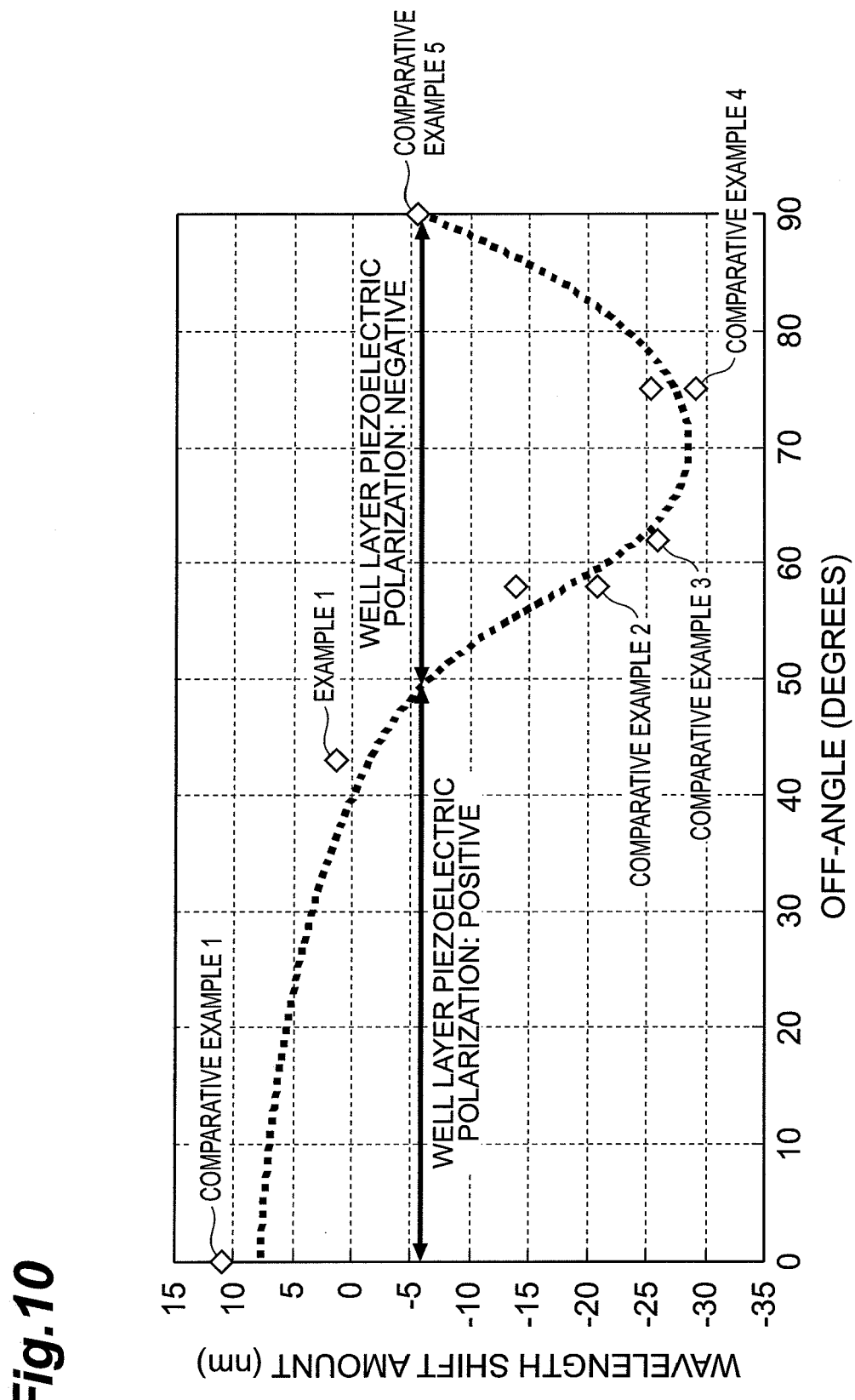
FIG. 10 shows measurement results for Example 1 and Example 2, and Comparative Example 1 to Comparative Example 5.

FIG. 10 shows the off-angle dependence of the shift amount of the PL peak wavelength, determined from bias application PL measurement results for Example 1, Example 2, and Comparative Example 1 to Comparative Example 5. The PL peak wavelength shift amount was taken to be the difference between the PL peak wavelength when the bias was 0 V, and the PL peak wavelength immediately after the start of EL emission. In FIG. 10, because in the case of Comparative Example 5 (plane direction (10-10), off-angle 90° (m axis direction)) the principal surface is the m plane, the internal electric field is 0. Hence in examples or comparative examples in which the wavelength shift amount is larger than that in Comparative Example 5, the piezoelectric polarization is positive, and in examples or comparative examples in which the wavelength shift amount is smaller than that in Comparative Example 5, the piezoelectric polarization is negative. As shown in FIG. 10, the direction of the piezoelectric polarization in the well layers was positive for Comparative Example 1 and Example 1, and the direction of the piezoelectric polarization in the well layers was negative for Comparative Example 2 to Comparative Example 4. Here, when similar LEDs are fabricated using GaN substrates having as principal surface the surfaces equivalent to the rear surfaces of the GaN substrates of Comparative Example 2 to Comparative Example 4, the piezoelectric polarization of the well layers is positive. Hence it was found that if similar LEDs are fabricated using GaN substrates having as principal surface the (11-2-2) plane (equivalent to the rear surface of the GaN substrate of Comparative Example 2), the (10-1-1) plane (equivalent to the rear surface of the GaN substrate of Comparative Example 3), and the (20-2-1) plane (equivalent to the rear surface of the GaN substrate of Comparative Example 4; the principal surface of the GaN substrate of Example 2), then the piezoelectric polarization of the well layers is positive. In FIG. 10, the shift amounts of the PL peak wavelength are also plotted for other comparative examples fabricated under the same conditions as Comparative Example 2 and for other comparative examples fabricated under the same conditions as Comparative Example 4.

Figure 11:
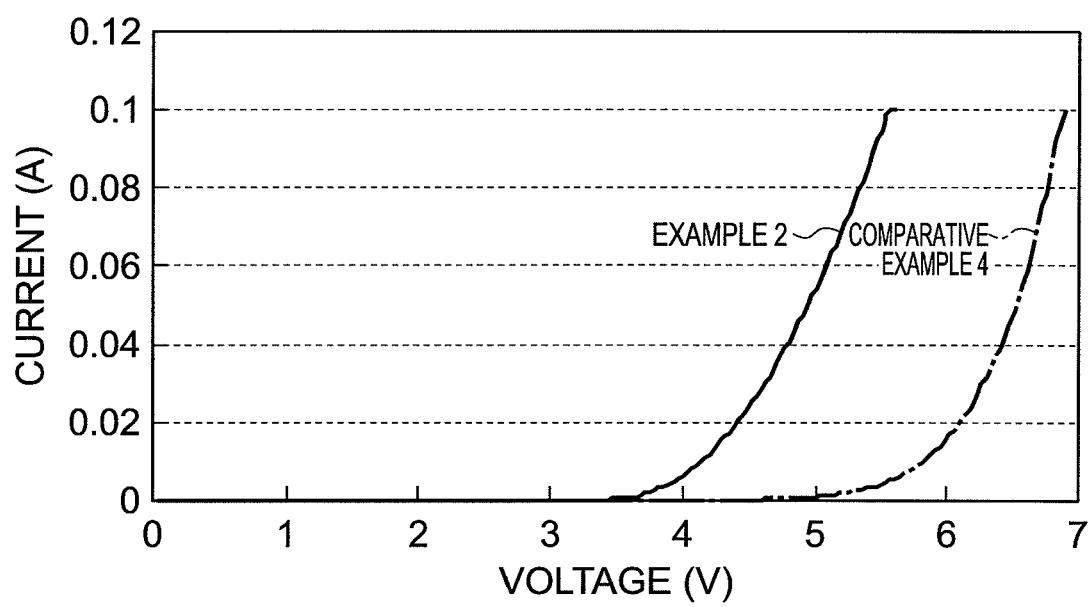
FIG. 11 shows measurement results for voltage-current characteristics for Example 2 and Comparative Example 4.

Next, voltage-current characteristics were compared for Example 2 and Comparative Example 4. The rear surface of the GaN substrate of Comparative Example 4 is equivalent to the principal surface of the GaN substrate of Example 2. As explained above, the direction of piezoelectric polarization of the well layers in Example 2 is positive, and the direction of piezoelectric polarization of the well layers in Comparative Example 4 is negative. FIG. 11 shows measurement results for the voltage-current characteristics of Example 2 and Comparative Example 4. As shown in FIG. 11, the driving voltage was lower for Example 2. From this it was found that by making the direction of piezoelectric polarization of the well layers positive, the driving voltage can be reduced.

Figure 12:
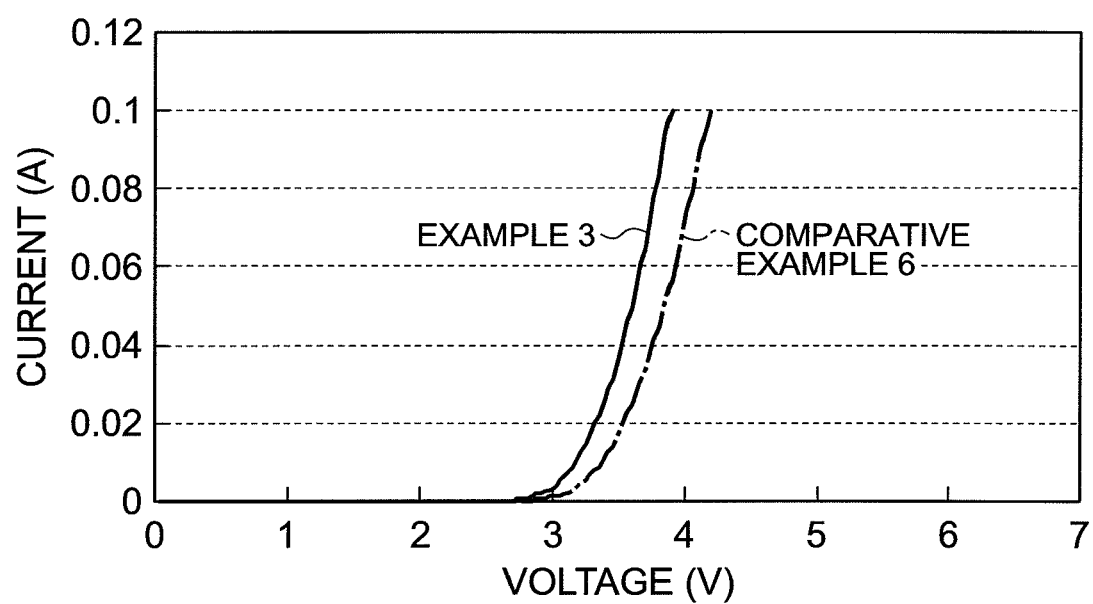
FIG. 12 shows measurement results for voltage-current characteristics for Example 3 and Comparative Example 6.

Similarly, voltage-current characteristics were compared for Example 3 and Comparative Example 6. The rear surface of the GaN substrate of Comparative Example 6 is equivalent to the principal surface of the GaN substrate of Example 3. As explained above, the direction of piezoelectric polarization of the well layers in Example 3 is positive, and the direction of piezoelectric polarization of the well layers in Comparative Example 6 is negative. FIG. 12 shows measurement results for voltage-current characteristics for Example 3 and Comparative Example 6. As shown in FIG. 12, the driving voltage was lower for Example 3. From this it was found that by making the direction of piezoelectric polarization of the well layers positive, the driving voltage can be lowered. However, the extent of reduction of the driving voltage for 400 nm band LEDs (Example 3 and Comparative Example 6) shown in FIG. 12 was small compared with the extent of reduction of the driving voltage for 500 nm band LEDs (Example 2 and Comparative Example 4) shown in FIG. 11. This is thought to be because the potential of the conduction band of the well layers in Example 3 and Comparative Example 6 is shallow, so that even in the case of Comparative Example 6, in which the direction of piezoelectric polarization of the well layers is negative, electrons can move comparatively easily from a certain well layer to a nearby well layer. By this means, it is thought that the effect of lowering the driving voltage by making the direction of piezoelectric polarization of the well layers positive can be more prominently exhibited when the potential of the conduction band of the well layers is deep.

Figure 13:
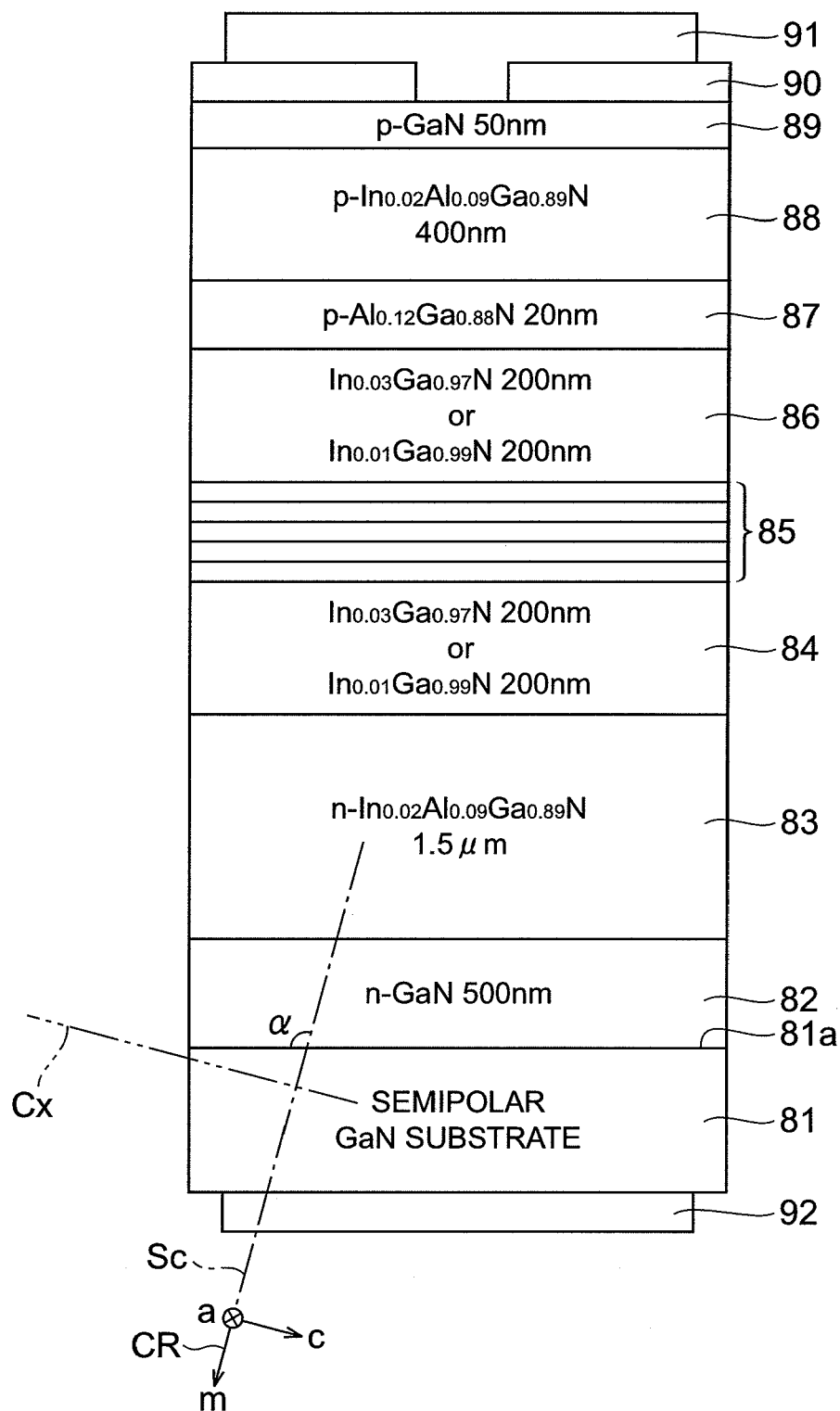
FIG. 13 shows the LD structure of Example 4 and Example 5.

Next, LDs (laser diodes) were fabricated as Example 4 and Example 5. FIG. 13 shows the LD structure of Example 4 and Example 5. As shown in FIG. 13, a GaN substrate 81 was prepared. The value of the finite angle α (off-angle) made by the principal surface 81a of the GaN substrate 81 and the reference plane Sc perpendicular to the reference axis Cx was 105°. That is, the plane direction of the principal surface 81a in Example 4 and Example 5 was (20-1-1). The GaN substrate 81 was placed in a growth reactor, ammonia (NH$_3$) and hydrogen (H$_2$) were supplied, and the GaN substrate 81 was held for 10 minutes in an atmosphere at 1050° C. After this pretreatment (thermal cleaning), raw material gas was supplied to the growth reactor, and structures for LDs were fabricated as follows.

First, an n-type GaN layer 82 was grown to 500 nm at 1050° C. An n-type In$_{0.02}$Al$_{0.09}$Ga$_{0.89}$N cladding layer 83 was grown to 1.2 μm at 880° C. An n-type InGaN guiding layer 84 was grown to 200 nm at 840° C. Here, the composition of the n-type InGaN guiding layer 84 in Example 4 was In$_{0.03}$Ga$_{0.97}$N, and the composition of the InGaN guiding layer 84 in Example 5 was In$_{0.01}$Ga$_{0.99}$N. The n-type InGaN guiding layer 84 functions as a strain relaxation layer. Next, the light-emitting layer 85 was grown. The light-emitting layer 85 had a quantum well structure in which were layered, in alternation, barrier layers comprising 15 nm GaN and well layers comprising 3 nm In$_{0.30}$Ga$_{0.70}$N. The number of well layers was two. The well layer growth temperature was 740° C., and the barrier layer growth temperature was 840° C.

Next, an InGaN guiding layer 86 was grown to 200 nm at 840° C. Here, the composition of the InGaN guiding layer 86 in Example 4 was In$_{0.03}$Ga$_{0.97}$N, and the composition of the InGaN guiding layer 86 in Example 5 was In$_{0.01}$Ga$_{0.99}$N. A 20 nm p-type Al$_{0.12}$Ga$_{0.88}$N electron blocking layer 87, 400 nm p-type In$_{0.02}$Al$_{0.09}$Ga$_{0.89}$N cladding layer 88, and 50 nm p-type GaN contact layer 89 were grown in order at 1000° C. Further, on the p-type GaN contact layer 89, a pad electrode 91 comprising an Ni/Au p electrode and a Ti/Au layer was formed by evaporation deposition, via a stripe-shape opening of width 10 μm in an insulating film 90 comprising silicon oxide (SiO$_2$), and a pad electrode 92 comprising a Ti/Al n electrode and a Ti/Au layer was formed by evaporation deposition on the rear surface of the GaN substrate 81. And, the GaN substrate 81 was cleaved at 800 μm intervals in planes perpendicular to the direction of extension of the stripe-shape opening. A dielectric multilayer film comprising SiO$_2$/TiO$_2$ was formed on both end faces exposed by cleaving, and gain-guide type LDs were fabricated.

Cross-sectional TEM observations were performed for Example 4 and Example 5. In Example 4, misfit dislocations with a density of 2×10$^4$ cm$^{-1}$ were confirmed at the interface of the n-type In$_{0.02}$Al$_{0.09}$Ga$_{0.89}$N cladding layer 83 and the n-type InGaN guiding layer 84. In the light-emitting layer 85, no misfit dislocations were confirmed. In Example 5, no misfit dislocations were confirmed at the interface of the n-type In$_{0.02}$Al$_{0.09}$Ga$_{0.89}$N cladding layer 83 and the n-type InGaN guiding layer 84, but defects with a density of 1×10$^8$ cm$^{-2}$ penetrating to the surface of the light-emitting layer 85 from an interface of a well layer and bather layer were confirmed in the light-emitting layer 85. It is thought that in Example 4, strain was relaxed in the n-type InGaN guiding layer 84, so that even when the In content of the well layers was high, the occurrence of defects in the light-emitting layer 85 was suppressed.

REFERENCE SIGNS LIST

11 Gallium nitride substrate
11a Principal surface
13 n-type gallium nitride-based semiconductor region
17 Second gallium nitride-based semiconductor region
21 Well layer
23 Barrier layer
15 Light-emitting region
Cx Reference axis
LE1, LD1 Nitride-based semiconductor light-emitting element
Sc Reference plane

The invention claimed is:
1. A nitride-based semiconductor light-emitting element, comprising:
a GaN substrate, formed of a hexagonal GaN semiconductor and having a principal surface which makes a finite angle with a reference plane perpendicular to a reference axis extending in a c axis direction of the GaN semiconductor;

an n-type nitride-based semiconductor layer;
a p-type nitride-based semiconductor layer;
a light-emitting layer including a plurality of well layers and a plurality of barrier layers, which are layered in alternation; and
a strain relaxation layer formed of InGaN,
wherein the strain relaxation layer includes defects due to misfit dislocations at an interface on the GaN substrate side of the strain relaxation layer;
wherein n-type nitride-based semiconductor layer is provided between the GaN substrate and the light-emitting layer,
wherein the strain relaxation layer is provided between the n-type nitride-based semiconductor layer and the light-emitting layer,
wherein the principal surface exhibits semipolarity,
wherein the finite angle is in a range of greater than or equal to 40° to less than or equal to 50° or in a range of greater than 90° to less than or equal to 130°,
wherein the light-emitting layer is provided between the n-type nitride-based semiconductor layer and the p-type nitride-based semiconductor layer,
wherein each of the plurality of well layers is formed of InGaN,
wherein each of the plurality of barrier layers is formed of a GaN-based semiconductor,
wherein a difference between a band gap energy of each of the plurality of well layers and a band gap energy of a barrier layer, from among the plurality of barrier layers, which is adjacent to each of the well layers is 0.7 eV or greater, and
wherein a direction of piezoelectric polarization of each of the plurality of well layers is a direction from the n-type nitride-based semiconductor layer toward the p-type nitride-based semiconductor layer.

2. The nitride-based semiconductor light-emitting element according to claim 1, wherein a light emission wavelength of the light-emitting layer is between 460 nm and 550 nm.

3. The nitride-based semiconductor light-emitting element according to claim 1, wherein the principal surface is a {10-12} plane.

4. The nitride-based semiconductor light-emitting element according to claim 1, wherein the principal surface is an {11-2-2} plane.

5. The nitride-based semiconductor light-emitting element according to claim 1, wherein the principal surface is a {10-1-1} plane.

6. The nitride-based semiconductor light-emitting element according to claim 1, wherein the finite angle is in a range 100° to 117°.

7. The nitride-based semiconductor light-emitting element according to claim 1, wherein a density of the defect at the interface on the GaN substrate side of the strain relaxation layer is $1\times10^5$ cm$^{-1}$ or lower.

8. The nitride-based semiconductor light-emitting element according to claim 1, wherein a density of the defect at the interface on the GaN substrate side of the strain relaxation layer is $5\times10^3$ cm$^{-1}$ or higher.

9. The nitride-based semiconductor light-emitting element according to claim 1, wherein 50% or more by volume of the n-type nitride semiconductor layer is formed of GaN or InAlGaN.

10. The nitride-based semiconductor light-emitting element according to claim 6, wherein the principal surface is a {20-2-1} plane.

* * * * *